United States Patent
Horng et al.

(10) Patent No.: US 11,942,897 B2
(45) Date of Patent: Mar. 26, 2024

(54) CRYSTAL OSCILLATOR, AND METHOD FOR MAKING THE SAME

(71) Applicants: National Yang Ming Chiao Tung University, Hsinchu (TW); AKER TECHNOLOGY CO., LTD., Taichung (TW)

(72) Inventors: Ray-Hua Horng, Taichung (TW); Yi-Lun Lin, Taichung (TW)

(73) Assignees: NATIONAL YANG MING CHIAO TUNG UNIVERSITY, Hsinchu (TW); AKER TECHNOLOGY CO., LTD., Taichung (TW)

(*) Notice: Subject to any disclaimer, the term of this patent is extended or adjusted under 35 U.S.C. 154(b) by 0 days.

(21) Appl. No.: 17/898,747

(22) Filed: Aug. 30, 2022

(65) Prior Publication Data

US 2023/0061409 A1     Mar. 2, 2023

(30) Foreign Application Priority Data

Aug. 31, 2021  (TW) .................. 110132308

(51) Int. Cl.
  *H03B 5/32*   (2006.01)
  *H10N 30/06*  (2023.01)
  *H10N 30/082* (2023.01)

(52) U.S. Cl.
  CPC .............. *H03B 5/32* (2013.01); *H10N 30/06* (2023.02); *H10N 30/082* (2023.02); *H03B 2200/0022* (2013.01)

(58) Field of Classification Search
  CPC ........ H03B 5/32; H10N 30/06; H10N 30/082; H03H 9/1014; H03H 9/035; H03H 9/02023; H03H 9/02125; H03H 9/0561; H03H 9/19; H03H 2003/023; H03H 2003/0435
  See application file for complete search history.

(56) References Cited

U.S. PATENT DOCUMENTS

2021/0111702 A1*  4/2021  Wang .................. H03H 9/173
2021/0281243 A1*  9/2021  Sui ..................... H03H 9/0504

FOREIGN PATENT DOCUMENTS

JP    2012165367 A    8/2012
JP    2013012977 A    1/2013

OTHER PUBLICATIONS

Office Action issued to Japanese counterpart application No. 2022-044564 by the JPO dated Jun. 2, 2023, with an English translation thereof.
Office Action issued to Japanese counterpart application No. 2022044564 by the JPO dated Nov. 14, 2023, with an English translation thereof.

* cited by examiner

*Primary Examiner* — Jeffrey M Shin
(74) *Attorney, Agent, or Firm* — Nixon & Vanderhye PC

(57) ABSTRACT

A crystal oscillator includes an oscillating substrate, a hollow frame, a first electrode, and a second electrode. The oscillating substrate includes a main oscillating region and a thinned region that has a thickness smaller than that of the main oscillating region. The first and second electrodes are disposed on a first surface of the oscillating substrate and a second surface opposite to the first surface, respectively. The hollow frame is disposed on the second surface. The second electrode includes a second electrode portion that has at least one opening in positional correspondence with the thinned region. A method for making the crystal oscillator is also provided herein.

7 Claims, 6 Drawing Sheets

CRYSTAL OSCILLATOR, AND METHOD FOR MAKING THE SAME

CROSS-REFERENCE TO RELATED APPLICATION

This application claims priority of Taiwanese Invention Patent Application No. 110132308, filed on Aug. 31, 2021.

FIELD

The disclosure relates to an oscillator and a method for making the same, and more particularly to a crystal oscillator having a high oscillation frequency, and a method for making the same.

BACKGROUND

A conventional crystal oscillator generally includes an oscillation plate made of quartz crystal, and two electrodes that are respectively formed on two opposite surfaces of the oscillation plate and that are used for external electrical connection. In order to meet industry needs, thin and lightweight crystal oscillators are gradually becoming a trend. By reducing the thickness of the oscillation plate, the crystal oscillator can generate a higher oscillation frequency, which is conducive for application in the field of high frequency communication. Japanese Invention Patent Application Publication No. JP2014154994A discloses an oscillation device in which a substrate of the oscillation device includes a flat oscillation portion that is formed by partially thinning the substrate of the oscillation device, and a thick portion that is integrally formed with the flat oscillation portion and that has a thickness greater than that of the flat oscillation portion. By controlling the overall thickness of the substrate of the oscillation device (i.e., adjusting the thickness of the flat oscillation portion in a central region of the substrate, and the thick portion in a peripheral region of the substrate), a predetermined oscillation frequency of the oscillation device can be attained. In addition, with the thick portion which enhances the strength of the oscillation device and which is used as a pick-up portion in the subsequent process, breakage of the oscillation device caused by poor strength of the thinned substrate might be avoided during the manufacturing process.

However, the aforesaid thick portion that is formed to prevent the breakage of the oscillation device might increase the total weight of the oscillation device, which is not conducive for manufacturing a lightweight oscillation device.

SUMMARY

An object of the disclosure is to provide a crystal oscillator, and a method for making the same, which can alleviate or overcome the aforesaid shortcomings of the prior art.

According to a first aspect of the disclosure, a method for making a crystal oscillator includes the steps of:

a) forming a first electrode portion on a surface of a piezoelectric substrate, so as to obtain a first semi-finished product;

b) attaching the first semi-finished product on a temporary substrate with the first electrode portion facing the temporary substrate;

c) thinning the piezoelectric substrate of the first semi-finished product, so as to obtain a thinned piezoelectric substrate having a first thickness and having a first surface on which the first electrode portion is formed;

d) forming a second electrode on a second surface of the thinned piezoelectric substrate opposite to the temporary substrate, the second electrode including a second electrode portion having at least one opening, and a second extending electrode portion extending outwardly from the second electrode portion and disposed on a peripheral region of the thinned piezoelectric substrate, a projection of the second electrode portion on the second surface of the thinned piezoelectric substrate partially overlapping a projection of the first electrode portion on the second surface of the thinned piezoelectric substrate;

e) forming a first extending electrode portion that extends from the first electrode portion along a side surface of the thinned piezoelectric substrate to the second surface of the thinned piezoelectric substrate;

f) forming a hollow frame on the second surface of the thinned piezoelectric substrate, the hollow frame surrounding the second electrode portion, and disposed on the second extending electrode portion; and g) etching a portion of the thinned piezoelectric substrate in positional correspondence with the at least one opening using the second electrode as a mask.

According to a second aspect of the disclosure, a crystal oscillator includes an oscillating substrate, a hollow frame, a first electrode, and a second electrode.

The oscillating substrate includes a first surface, a second surface opposite to the first surface, a side surface interconnecting the first surface and the second surface, and an oscillating portion. The oscillating portion has a main oscillating region and a thinned region that has a thickness smaller than that of the main oscillating region.

The hollow frame is disposed on the second surface of the oscillating substrate, and exposes the oscillating portion.

The first electrode includes a first electrode portion formed on the first surface of the oscillating substrate, and a first extending electrode portion extending from the first electrode portion on the first surface along the side surface to the second surface.

The second electrode is disposed on the second surface of the oscillating substrate, and includes a second electrode portion and a second extending electrode portion extending from the second electrode portion toward the first extending electrode portion on the second surface. A projection of the second electrode portion on the second surface of the oscillating substrate partially overlaps a projection of the first electrode portion on the second surface of the oscillating substrate. The second electrode portion has at least one opening in positional correspondence with the thinned region.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
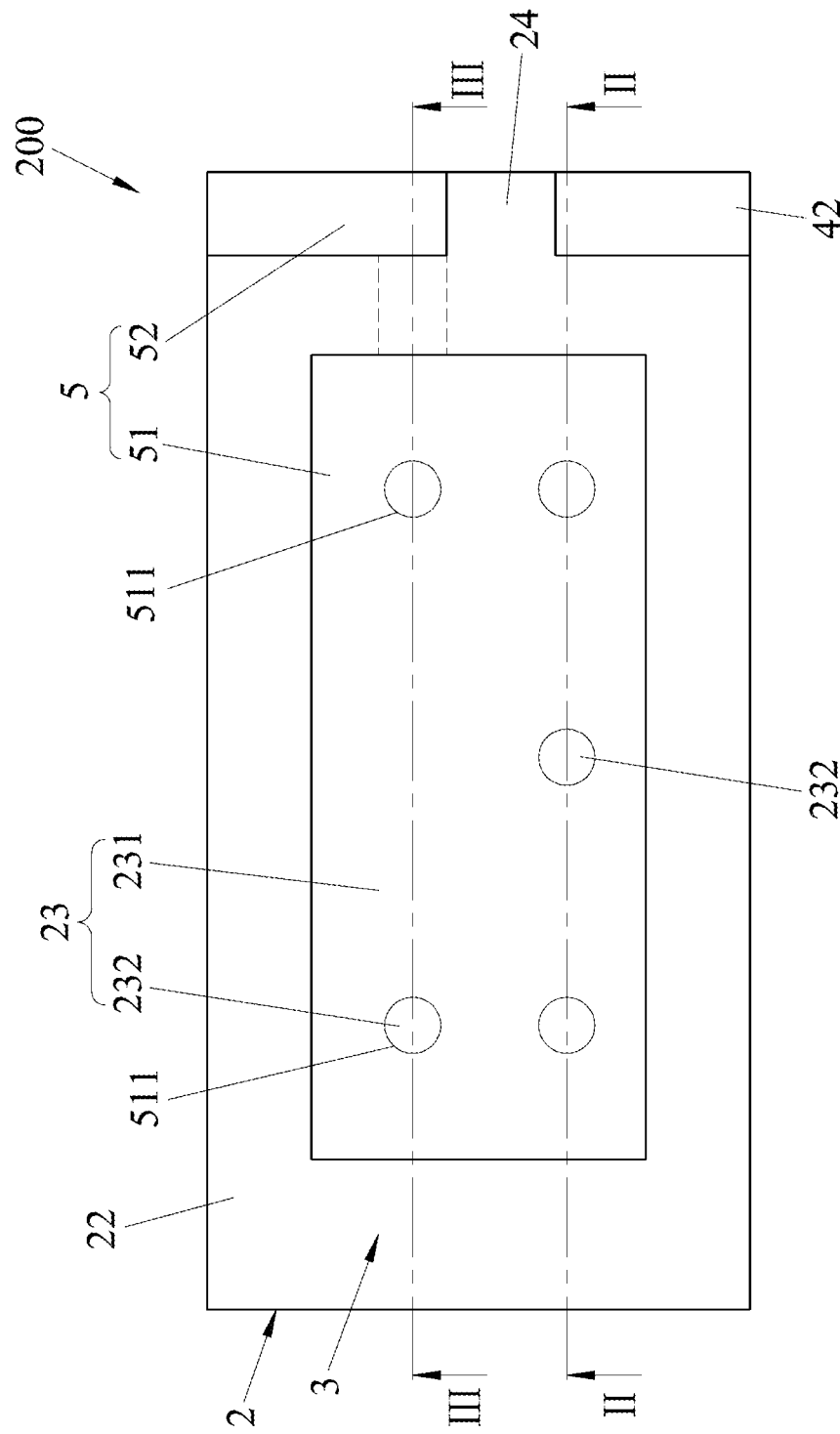
FIG. 1 is a schematic top view illustrating an embodiment of a crystal oscillator according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
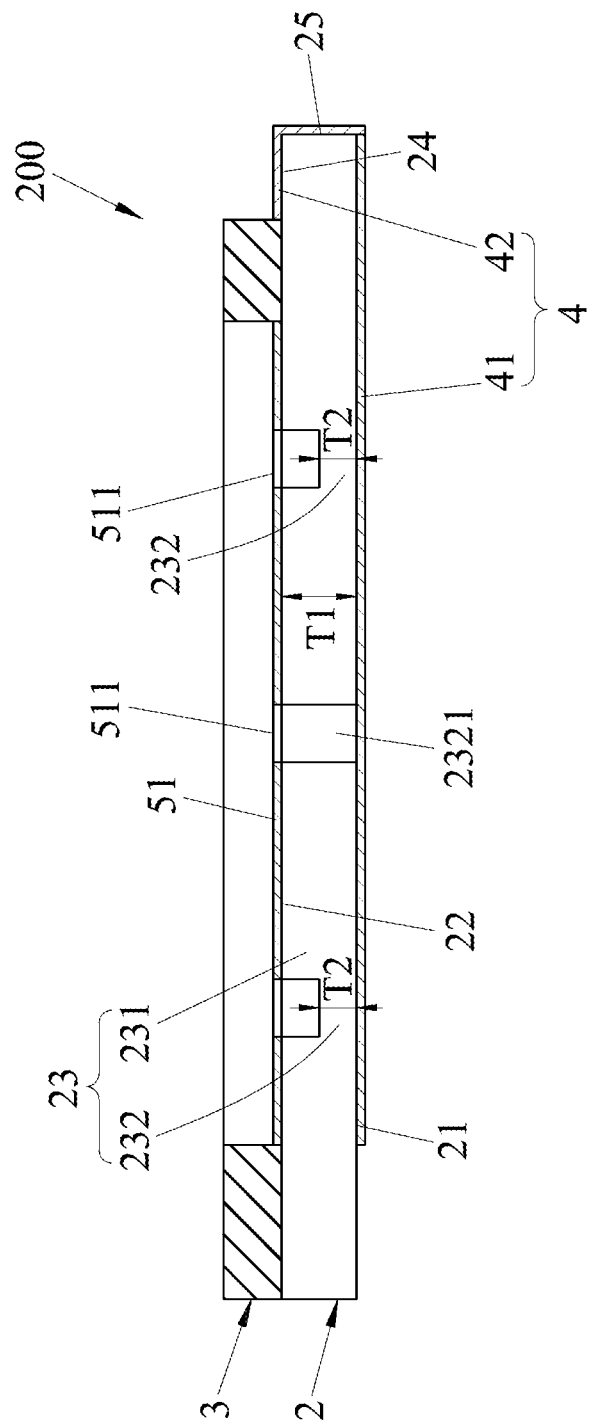
FIG. 2 is a cross-sectional view taken along line II-II of FIG. 1.
Figure 3:
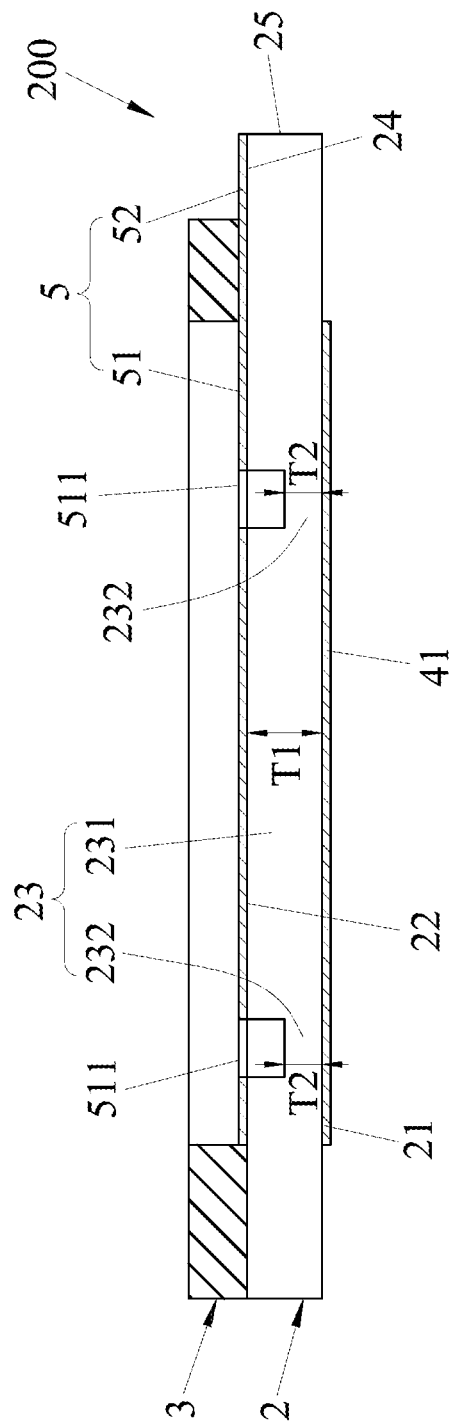
FIG. 3 is a cross-sectional view taken along line III-III of FIG. 1.

Referring to FIGS. 1 to 3, an embodiment of a crystal oscillator 200 according to the present disclosure includes an oscillating substrate 2, a hollow frame 3, a first electrode 4, and a second electrode 5.

The oscillating substrate 2 includes a first surface 21, a second surface 22 opposite to the first surface 21, a side surface 25 interconnecting the first surface 21 and the second surface 22, and an oscillating portion 23. The oscillating portion 23 has a main oscillating region 231 having a first thickness (T1), and a thinned region 232 having a second thickness (T2). The second thickness (T2) of the thinned region 232 is smaller than the first thickness (T1) of the main oscillating region 231. In this embodiment, the first thickness (T1) of the main oscillating region 231 is not greater than 50 μm, and the second thickness (T2) of the thinned region 232 is not greater than 10 μm. The oscillating substrate 2 is made of a piezoelectric material having a characteristic resonant frequency, such as quartz crystal.

In certain embodiments, the thinned region 232 has a through hole 2321 that penetrates through the oscillating portion 23 (see FIG. 2) to thereby decrease the total weight of the crystal oscillator 200. In certain embodiments, the second thickness (T2) of the thinned region 232 is zero, in other words, the thinned region 232 is formed as the through hole 2321.

The hollow frame 3 is disposed on the second surface 22 of the oscillating substrate 2, and surrounds the oscillating portion 23. The hollow frame 3 is used to increase a thickness of the crystal oscillator 200 and provides a pick-up position, which facilitates disposing the crystal oscillator 200 in an electronic component. The hollow frame 3 may be made of an insulating material or a photoresist material. There are no particular limitations on the width, shape, and disposition of the hollow frame 3.

The first electrode 4 includes a first electrode portion 41 formed on the first surface 21 of the oscillating substrate 2, and a first extending electrode portion 42 extending from the first electrode portion 41 on the first surface 21 along the side surface 25 to the second surface 22. In this embodiment, the first electrode portion 41 is formed within a projection of the oscillating portion 23 on the first surface 21, and the first extending electrode portion 42 is located on the side surface 25 and the second surface 22 outside the hollow frame 3.

The second electrode 5 is disposed on the second surface 22 of the oscillating substrate 2, and includes a second electrode portion 51 and a second extending electrode portion 52 extending from the second electrode portion 51 toward the first extending electrode portion 42 on the second surface 22. A projection of the second electrode portion 51 on the second surface 22 of the oscillating substrate 2 partially overlaps a projection of the first electrode portion 41 on the second surface 22 of the oscillating substrate 2. The second electrode portion 51 is located on the oscillating portion 23. The second electrode portion 51 has at least one opening 511 in positional correspondence with the thinned region 232. The position and number of the opening 511 may vary depending on needs. The second electrode portion 51 may have a single opening 511.

Each of the first electrode 4 and the second electrode 5 may be made of a conductive material, such as gold, silver, or aluminum. The first electrode 4 and the second electrode 5 may be made of the same or different materials.

In this embodiment, the second surface 22 of the oscillating substrate 2 includes two spaced-apart peripheral areas 24 that are located at a same side of the second surface 22, and that are located outside the oscillating portion 23 and exposed from the hollow frame 3. The first extending electrode portion 42 extends onto one of the peripheral areas 24, and the second extending electrode portion 52 extends from the second electrode portion 51 onto the other one of the peripheral areas 24. In addition, the two spaced-apart peripheral areas 24 are located on a peripheral region of the oscillating substrate 2 that is located outside the main oscillating region 231 and that has a thickness that is the same as that of the main oscillating region 231, so that the first extending electrode portion 42 and the second extending electrode portion 52 are located at the same level and at the same side of the second surface 22, which is conducive for externally connecting to other electronic components.

By the formation of the thinned region 232 which may have a reduced second thickness (T2) or be in the form of the through hole 2321, the total weight of the crystal oscillator 200 can be further decreased.

Figure 4:
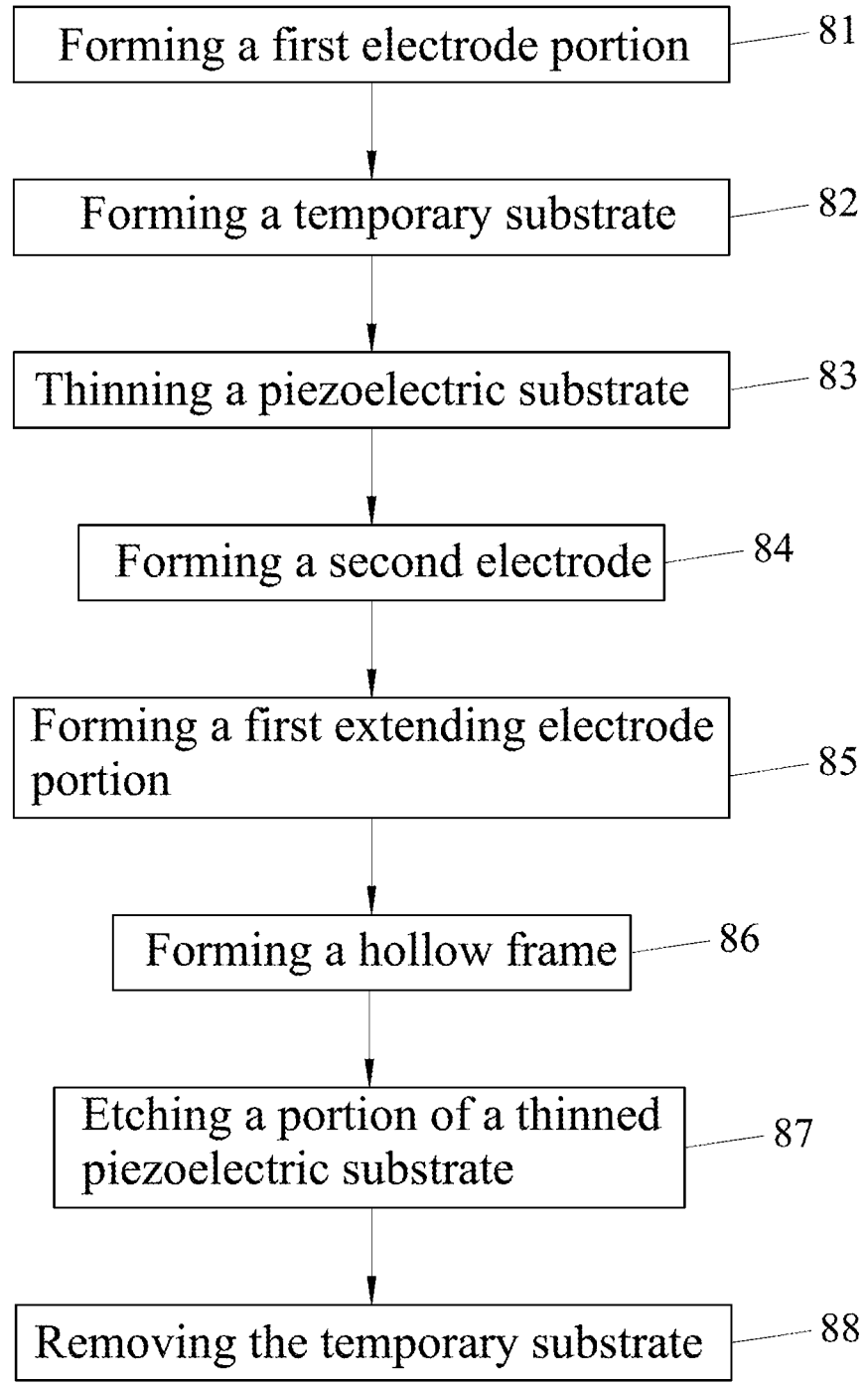
FIG. 4 is a flow chart illustrating consecutive steps of a method for making the embodiment of a crystal oscillator according to the disclosure.
Figure 5:
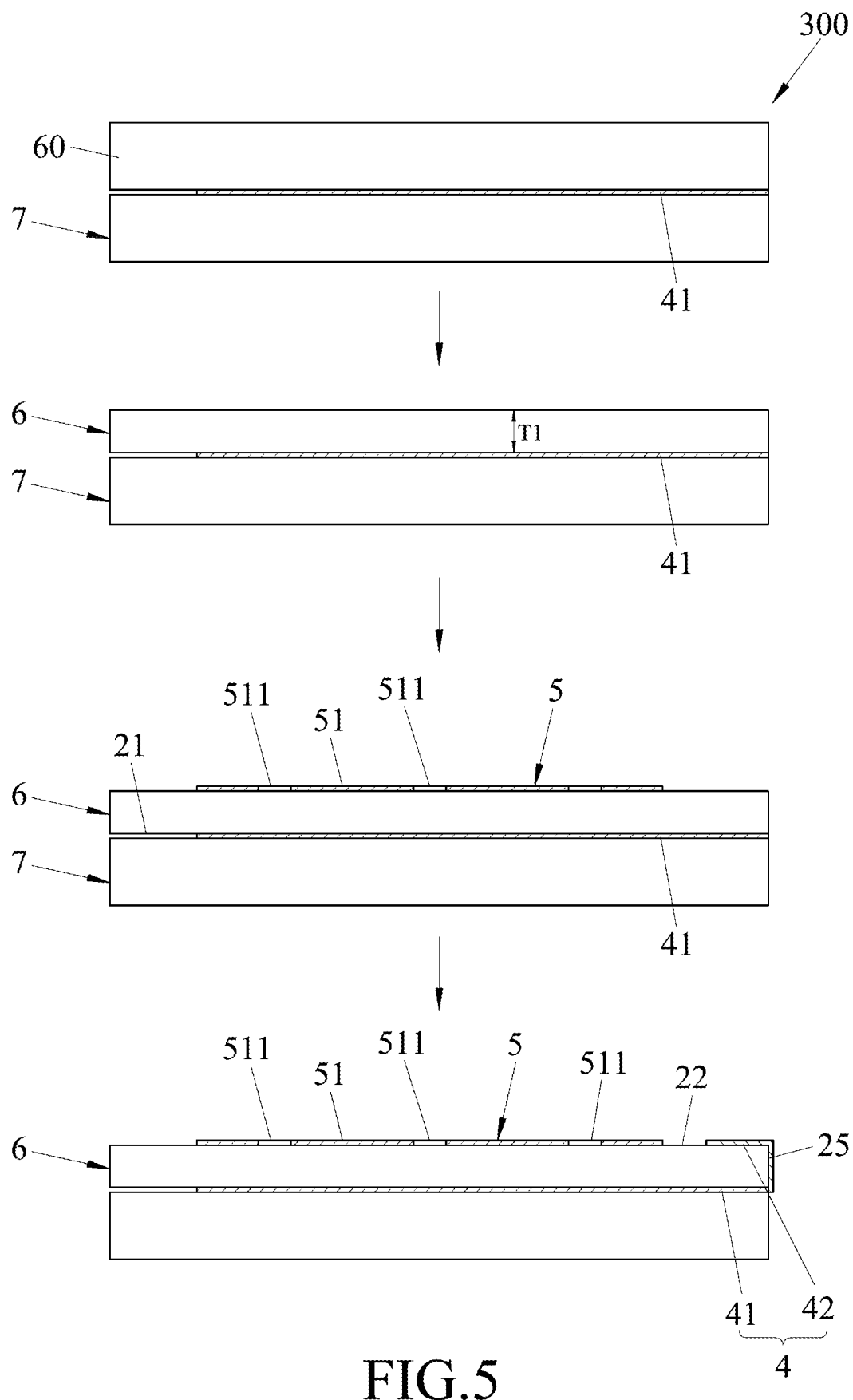
FIG. 5 is a schematic side view illustrating steps S81 to S85 of the embodiment of the method for making the embodiment of a crystal oscillator according to the disclosure.
Figure 6:
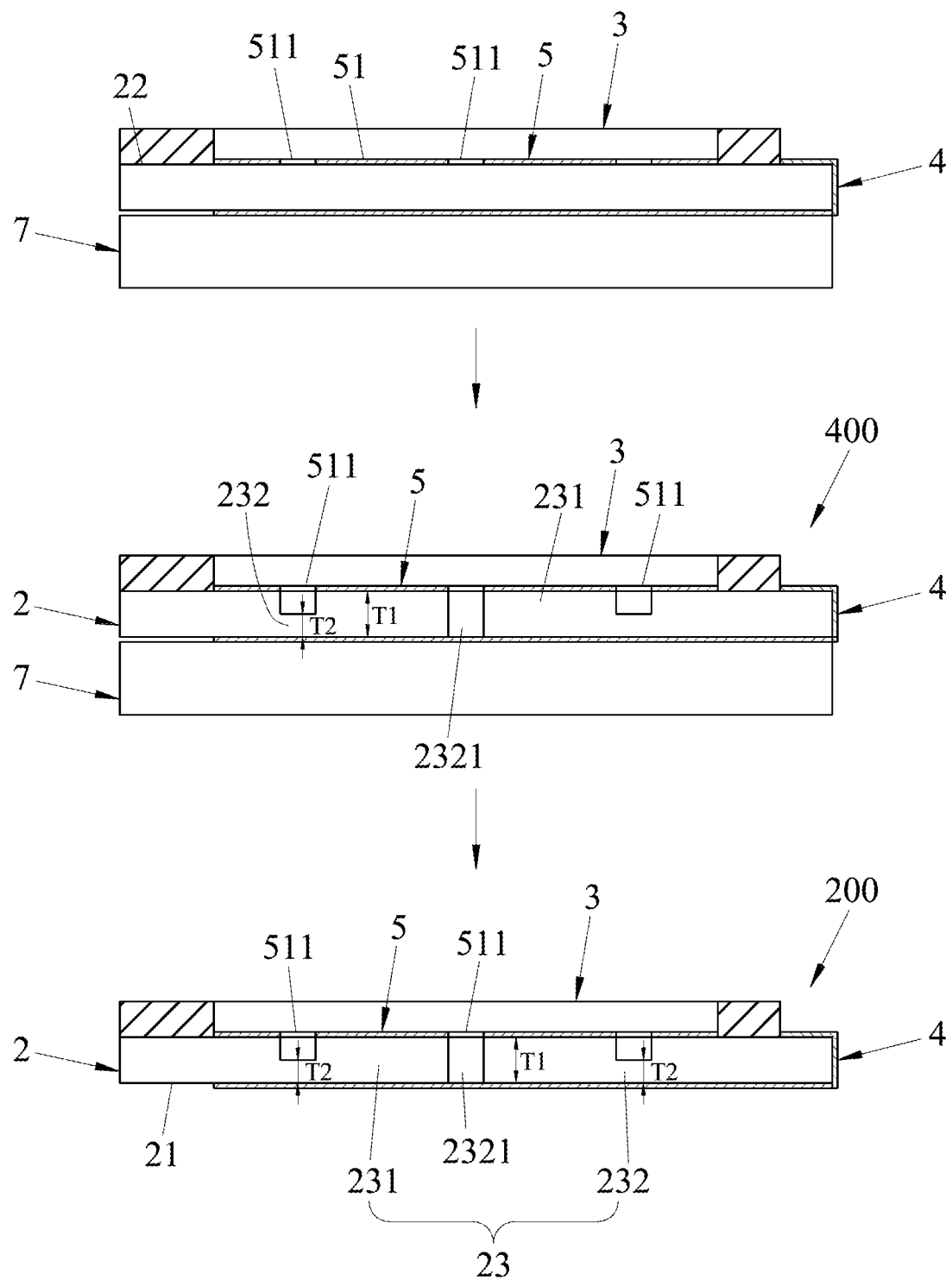
FIG. 6 is a schematic side view illustrating steps S86 to S88 of the embodiment of the method for making the embodiment of the crystal oscillator according to the disclosure.

Referring to FIGS. 4 to 6, this disclosure also provides a method for making the embodiment of the crystal oscillator 200, which includes the following steps S81 to S88.

In step S81, the first electrode portion 41 is formed on a surface of a piezoelectric substrate 60, so as to obtain a first semi-finished product 300. In this step, the piezoelectric substrate 60 is made of quartz crystal, and the first electrode portion 41 is formed by depositing or printing a conductive material on the surface of the piezoelectric substrate 60.

In step S82, the first semi-finished product 300 is attached to a temporary substrate 7 with the first electrode portion 41 facing the temporary substrate 7, to thereby support the piezoelectric substrate 60 and prevent the piezoelectric substrate 60 from breaking during subsequent processes.

In step S83, the piezoelectric substrate 60 of the first semi-finished product 300 is thinned, so as to obtain the thinned piezoelectric substrate 6 having the first thickness (T1) that is smaller than the thickness of the piezoelectric substrate 60. In this step, the piezoelectric substrate 60 of the first semi-finished product 300 is thinned by a polishing process or a chemical etching process, so as to obtain the thinned piezoelectric substrate 6 having the first surface 21 on which the first electrode portion 41 is formed.

In step S84, the second electrode 5 is formed on the second surface 22 of the thinned piezoelectric substrate 6 opposite to the temporary substrate 7. The second electrode 5 includes the second electrode portion 51 having at least one opening 511, and the second extending electrode portion 52. The detailed structure of the second electrode 5 may be referred back to FIGS. 1 and 3 and the relevant description thereof. The second surface 22 of the thinned piezoelectric substrate 6 is exposed from the at least one opening 511. In this step, the second electrode 5 is formed by depositing or printing a conductive material on the second surface 22 of the thinned piezoelectric substrate 6.

In step S85, the first extending electrode portion 42 that extends from the first electrode portion 41 is formed on the side surface 25 of the thinned piezoelectric substrate 6 and the second surface 22 of the thinned piezoelectric substrate 6. In this step, the first extending electrode portion 42 is formed by depositing or printing a conductive material on the side surface 25 and the second surface 22 of the thinned piezoelectric substrate 6.

In certain embodiments, according to processing requirements, step S85 may be conducted after step S83 and before step S84.

In certain embodiments, step S84 may be conducted by forming a portion of the first extending electrode portion 42 and the second extending electrode portion 52 on the second surface 22 of the thinned piezoelectric substrate 6, simultaneously. Afterwards, a silver paste is formed on the side surface 25 of the thinned piezoelectric substrate 6 to interconnect the first electrode portion 41 on the first surface 21 and the portion of the first extending electrode portion 42 on the second surface 22, so as to obtain the first electrode 4. In this embodiment, the silver paste and the portion of the first extending electrode portion 42 constitute the first extending electrode portion 42.

As shown in FIG. 6, in step S86, a hollow frame 3 is formed on the second surface 22 of the thinned piezoelectric substrate 6. The hollow frame 3 surrounds the second electrode portion 51, and is disposed on the second extending electrode portion 52. It is noted that, according to the material of the hollow frame 3, step S86 may be implemented in a different manner. For example, the hollow frame 3 can be formed by applying a photoresist material on the second surface 22 of the thinned piezoelectric substrate 6, and subjecting the photoresist material to photolithography. For another example, the hollow frame 3 can be formed using an insulating material in advance, followed by attaching the hollow frame to the second surface 22 of the thinned piezoelectric substrate 6.

In step S87, a portion of the thinned piezoelectric substrate 6 in positional correspondence with the at least one opening 511 of the second electrode portion 51 is etched using the second electrode 5 as a mask, so as to obtain a second semi-finished product 400. The etched portion of the thinned piezoelectric substrate 6 is defined as the thinned region 232. An unetched portion of the thinned piezoelectric substrate 6 in positional correspondence with the second electrode portion 51 is defined as the main oscillating region 231. The thinned piezoelectric substrate 6 having the main oscillating region 231 and the thinned region 232 constitutes the aforesaid oscillating substrate 2 (see FIG. 6). The second thickness (T2) of the thinned region 232 is smaller than the first thickness (T1) of the main oscillating region 231.

In certain embodiments, the second electrode portion 51 is formed with a plurality of openings 511, and, in step S87, the portion of the thinned piezoelectric substrate 6 in positional correspondence with some of the openings 511 of the second electrode portion 51 may be etched to form the through holes 2321 in the thinned piezoelectric substrate 6. In certain embodiments, the portion of the thinned piezoelectric substrate 6 in positional correspondence with all of the openings 511 may be etched all the way through. In such cases, the thinned region 232 is composed of the through holes 2321, and the second thickness (T2) of the thinned region 232 is zero. It is noted that, the thinned region 232 may be composed of a through hole 2321.

In step S88, the temporary substrate 7 is removed from the first electrode portion 41 on the first surface 21 of the thinned piezoelectric substrate 6. Procedure for implementing step S88 may be chosen according to the procedure for attaching the temporary substrate 7 on the first electrode portion 41 in step S82. For example, when step S82 is conducted using a photosensitive adhesive or a thermo-sensitive adhesive, step S88 may be conducted using light radiation or heat application so as to decompose the photo-sensitive adhesive or the thermo-sensitive adhesive, thereby removing the temporary substrate 7 from the first electrode portion 41.

The crystal oscillator 200 of this invention has the following advantages.

Firstly, because the first and second surfaces 21, 22 of the piezoelectric substrate 60 (i.e., the thinned piezoelectric substrate 6) are flat, formation of the first electrode portion 41 and the second electrode 5 would not be adversely affected by the surface morphology of the piezoelectric substrate 60 (i.e., the thinned piezoelectric substrate 6).

Secondly, compared with the conventional crystal oscillator, the thickness of the thinned piezoelectric substrate 6 (i.e., the first thickness (T1)) is reduced, the length of the first extending electrode portion 42 that extends to the second surface 22 of the thinned piezoelectric substrate 6 can be reduced, so as to simplify the process for making the first electrode 4 and the second electrode 5.

Thirdly, the total thickness of the oscillating substrate 2 of the crystal oscillator 200 can be adjusted by thinning the piezoelectric substrate 60 to obtain the thinned piezoelectric substrate 6, followed by etching the portion of the thinned piezoelectric substrate 6. In addition, the crystal oscillator 200 can attain the expected oscillation frequency because the first thickness (T1) of the main oscillating region 231 disposed between the first electrode portion 41 and the second electrode portion 51 remains the same.

In sum, by etching the portion of the thinned piezoelectric substrate 6 in positional correspondence with the at least one opening 511 using the second electrode 5 as a mask, the weight of the oscillating substrate 2 can be decreased, thereby further decreasing the weight of the crystal oscillator 200 and ensuring that the crystal oscillator 200 can attain the expected oscillation frequency.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A method for making a crystal oscillator, comprising the steps of:
    a) forming a first electrode portion on a surface of a piezoelectric substrate, so as to obtain a first semi-finished product;
    b) attaching the first semi-finished product on a temporary substrate with the first electrode portion facing the temporary substrate;
    c) thinning the piezoelectric substrate of the first semi-finished product, so as to obtain a thinned piezoelectric substrate having a first thickness and having a first surface on which the first electrode portion is formed;
    d) forming a second electrode on a second surface of the thinned piezoelectric substrate opposite to the temporary substrate, the second electrode including a second electrode portion having at least one opening, and a second extending electrode portion extending outwardly from the second electrode portion and disposed on a peripheral region of the thinned piezoelectric substrate, a projection of the second electrode portion on the second surface of the thinned piezoelectric substrate partially overlapping a projection of the first electrode portion on the second surface of the thinned piezoelectric substrate;
    e) forming a first extending electrode portion that extends from the first electrode portion along a side surface of the thinned piezoelectric substrate to the second surface of the thinned piezoelectric substrate;
    f) forming a hollow frame on the second surface of the thinned piezoelectric substrate, the hollow frame surrounding the second electrode portion, and disposed on the second extending electrode portion; and
    g) etching a portion of the thinned piezoelectric substrate in positional correspondence with the at least one opening using the second electrode as a mask.

2. The method of claim 1, wherein in step g), the portion of the thinned piezoelectric substrate in positional correspondence with the at least one opening is etched to form a through hole in the thinned piezoelectric substrate.

3. The method of claim 1, further comprising, after step g), removing the temporary substrate from the first electrode portion on the first surface of the thinned piezoelectric substrate.

4. A crystal oscillator, comprising:
    an oscillating substrate including a first surface, a second surface opposite to said first surface, a side surface interconnecting said first surface and said second surface, and an oscillating portion, said oscillating portion having a main oscillating region and a thinned region that has a thickness smaller than that of said main oscillating region;
    a hollow frame disposed on said second surface of said oscillating substrate, and exposing said oscillating portion;
    a first electrode including a first electrode portion formed on said first surface of said oscillating substrate, and a first extending electrode portion extending from said first electrode portion on said first surface along said side surface to said second surface; and
    a second electrode disposed on said second surface of said oscillating substrate, and including a second electrode portion, and a second extending electrode portion extending from said second electrode portion toward said first extending electrode portion on said second surface, a projection of said second electrode portion on said second surface of said oscillating substrate partially overlapping a projection of said first electrode portion on said second surface of said oscillating substrate, said second electrode portion having at least one opening in positional correspondence with said thinned region.

5. The crystal oscillator of claim 4, wherein said second surface of said oscillating substrate includes two spaced-apart peripheral areas that are located at a same side of said second surface, and that are located outside said oscillating portion and exposed from said hollow frame, said first extending electrode portion extending onto one of said peripheral areas, said second extending electrode portion extending from said second electrode portion onto the other one of said peripheral areas.

6. The crystal oscillator of claim 5, wherein said two spaced-apart peripheral areas are located on a portion of a peripheral region of said oscillating substrate that is located outside said main oscillating region and that has a thickness the same as that of said main oscillating region.

7. The crystal oscillator of claim 4, wherein said thinned region has a through hole that penetrates through said oscillating portion.

* * * * *